(12) United States Patent
Beer et al.

(10) Patent No.: US 7,922,093 B2
(45) Date of Patent: Apr. 12, 2011

(54) SEMICONDUCTOR CHIPS FOR TAG APPLICATIONS, DEVICES FOR MOUNTING THE SAME, AND MOUNTING METHOD

(75) Inventors: Gottfried Beer, Nittendorf (DE); Werner Weber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 440 days.

(21) Appl. No.: 11/938,857

(22) Filed: Nov. 13, 2007

(65) Prior Publication Data
US 2008/0121724 A1    May 29, 2008

Related U.S. Application Data

(63) Continuation of application No. PCT/DE2006/000725, filed on Apr. 26, 2006.

(30) Foreign Application Priority Data

May 12, 2005 (DE) .......................... 10 2005 022 780

(51) Int. Cl.
*G06K 19/06* (2006.01)
*G06K 19/00* (2006.01)
*G06K 5/00* (2006.01)
(52) U.S. Cl. .................... 235/492; 235/380; 235/487
(58) Field of Classification Search .................. 235/380, 235/487, 492
See application file for complete search history.

(56) References Cited

U.S. PATENT DOCUMENTS

| 3,783,499 | A | 1/1974 | Hughes, Jr. et al. |
| 4,437,362 | A | 3/1984 | Hurst |
| 4,601,382 | A | 7/1986 | Roberts et al. |
| 5,321,240 | A | 6/1994 | Takahira |
| 6,095,416 | A * | 8/2000 | Grant et al. .................... 235/449 |
| 2002/0013008 | A1 | 1/2002 | Sanaka et al. |
| 2004/0026006 | A1 | 2/2004 | Arai et al. |
| 2004/0038499 | A1 | 2/2004 | Kim et al. |
| 2005/0001711 | A1 * | 1/2005 | Doughty et al. ............. 340/5.74 |
| 2006/0131712 | A1 | 6/2006 | Jerebic et al. |

FOREIGN PATENT DOCUMENTS

| DE | 19743348 C2 | 8/1999 |
| DE | 19946254 A1 | 4/2001 |
| EP | 0905657 A1 | 3/1999 |
| JP | 59011639 | 1/1984 |
| JP | 59215739 | 12/1984 |
| WO | 2004012896 | 2/2004 |

* cited by examiner

*Primary Examiner* — Thien M. Le
*Assistant Examiner* — April A Taylor
(74) *Attorney, Agent, or Firm* — Edell, Shapiro & Finnan, LLC

(57) ABSTRACT

A TAG chip includes a magnetic coating or an electrostatically chargeable structure. A device for packing semiconductor chips includes an electromagnetic or electrostatic lifter, which picks up singulated semiconductor chips of a semiconductor wafer with a magnetic coating or including an electrostatically chargeable structure from a wafer position and deposits them in a collecting position. A mounting device includes a conveying roller with conveying receptacles for semiconductor chips, which pick up the semiconductor chips in a pick-up position with electromagnetically or electrostatically activatable conveying receptacles and, in a discharge position will discharge, via deactivation of the conveying receptacles, the semiconductor chips onto a corresponding liner or an object.

18 Claims, 3 Drawing Sheets

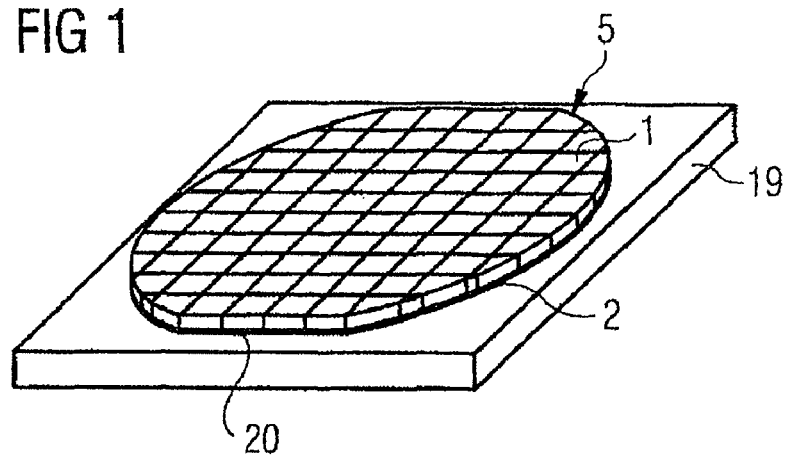
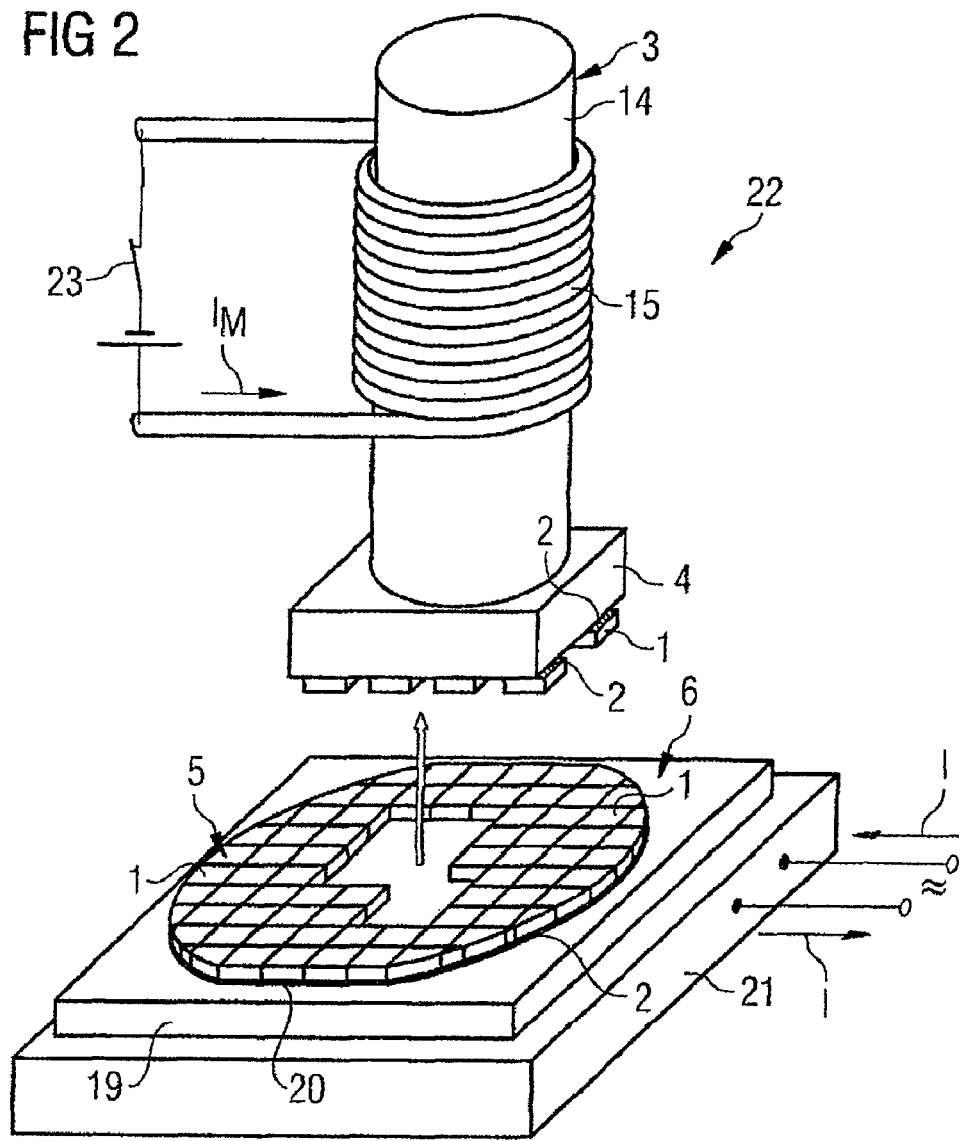

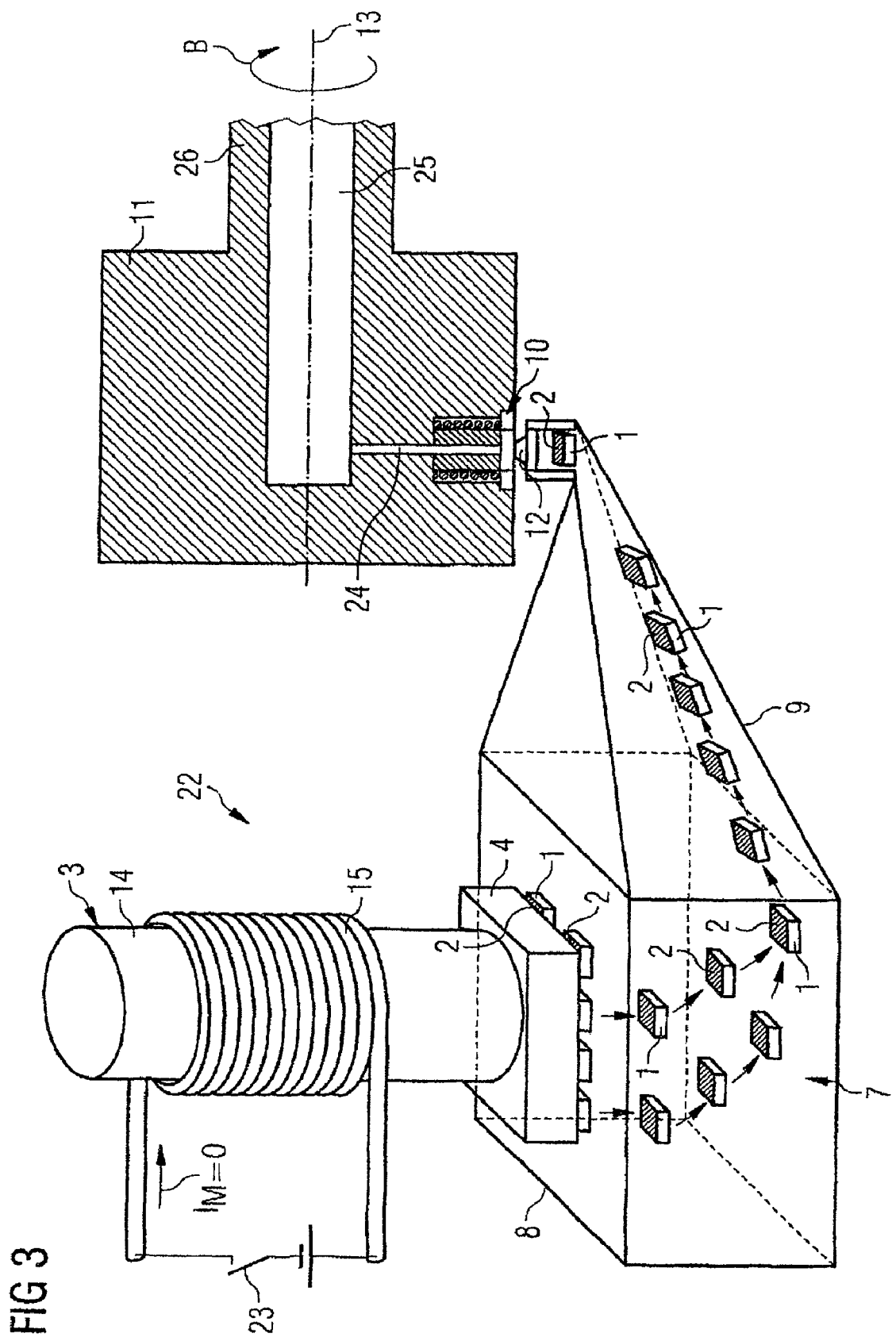

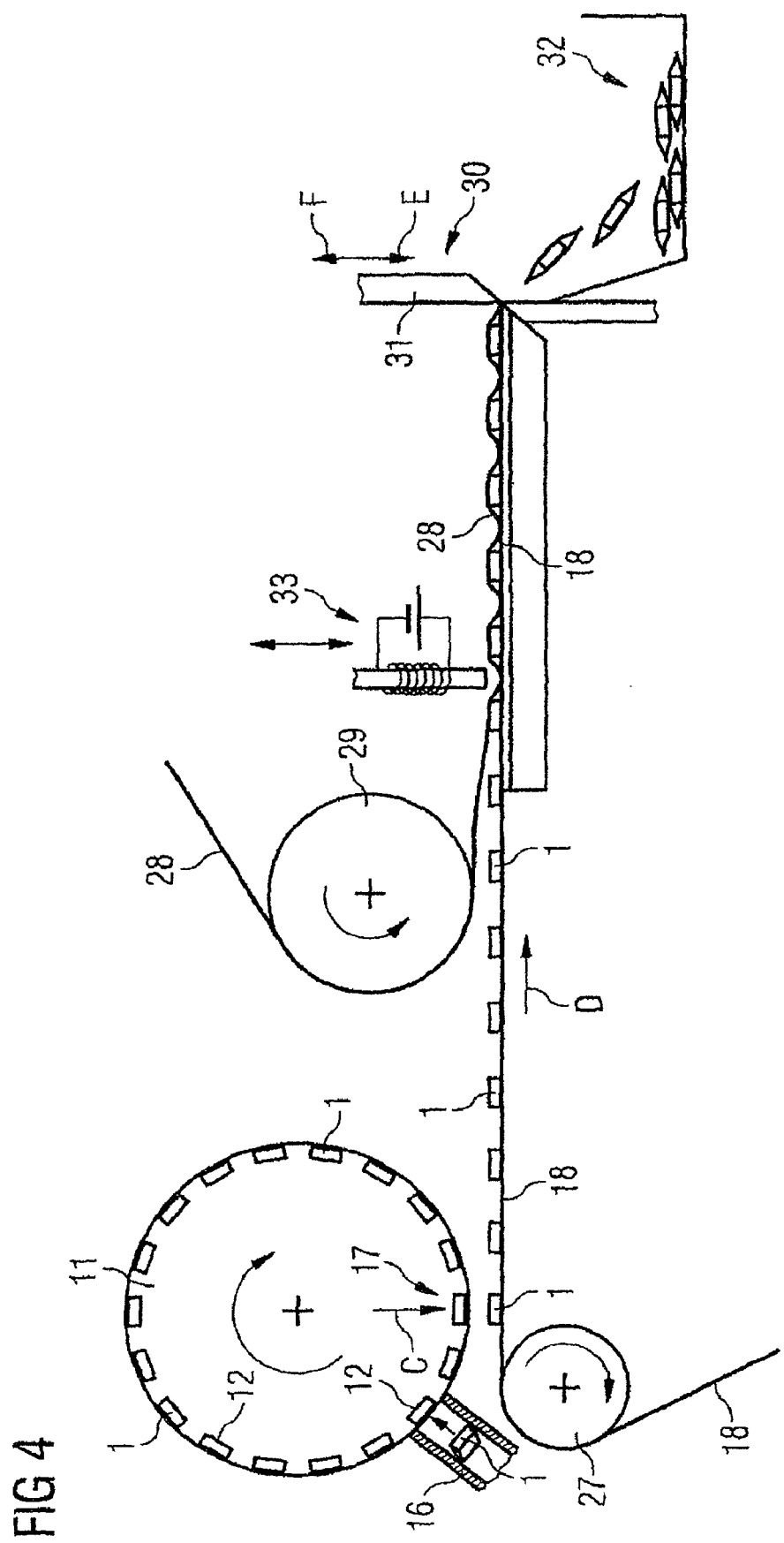

SEMICONDUCTOR CHIPS FOR TAG APPLICATIONS, DEVICES FOR MOUNTING THE SAME, AND MOUNTING METHOD

CROSS REFERENCE TO RELATED APPLICATIONS

This application is a continuation of International Application No. PCT/DE2006/000725, filed on Apr. 26, 2006, entitled "Semiconductor Chips for TAG Applications, Devices for Mounting These Semiconductor Chips and Mounting Method," which claims priority under 35 U.S.C. §119 to Application No. DE 102005022780.5 filed on May 12, 2005, entitled "Semiconductor Chips for TAG Applications, Devices for Mounting These Semiconductor Chips and Mounting Method," the entire contents of which are hereby incorporated by reference.

BACKGROUND

RF TAG chips have a transponder and a digital memory, which serve for labeling or identifying objects. Such known TAG chips can be incorporated in labels, banknotes, smart cards and the like. The TAG chip transponder has an antenna for reading out and writing in identification or label information, wherein this information is available upon RF remote retrieval or can be written to the digital memory by means of RF transmission.

The RF TAG chips have a typical chip size whose area is less than 0.5 mm$^2$ and whose thickness is less than 100 μm.

These small semiconductor chips have hitherto been taken from a sawing film and transferred to a liner with the aid of a semiconductor chip bonder in a "PICK and PLACE method". An adhesive for fixing the semiconductor chip on the liner is either applied by dispensing or may already be offered on the liner or is already situated on the semiconductor chip rear side.

This method requires at least 200 ms per semiconductor chip even when high-speed semiconductor chip bonders are used, such that an appreciable increase for manufacturing throughput is no longer possible. In this case, the liner has to be coordinated with the end product, which results in a corresponding diversity of types for the handling mechanism of the liner. This means that the device has to operate extremely flexibly in terms of the positioning and populating of liners.

The demand for smart cards or banknote labels and similar liners equipped with such semiconductor chips is constantly rising, however, such that singulating semiconductor chips of a semiconductor wafer and applying them to a liner by means of single bond wiring technology do not suffice to achieve an increased manufacturing rate corresponding to requirements.

SUMMARY

Described herein are semiconductor chips for RF TAG applications, devices for mounting semiconductor chips, a method for packing and mounting semiconductor chips, and a method for using the device. The TAG chips include a handling element with a magnetic coating or an electrostatically chargeable structure. In this respect, the device includes an electromagnetic or electrostatic lifter, which picks up singulated semiconductor chips of a semiconductor wafer with the handling element from a wafer position and deposits them in a collecting position. Also described herein is a mounting device including a conveying roller with conveying receptacles for semiconductor chips, which picks up the semiconductor chips in a pick-up position with electromagnetically or electrostatically activatable conveying receptacles and, in a discharge position, the conveying receptacles being deactivatable, will discharge the semiconductor chips onto a corresponding liner or a common object.

BRIEF DESCRIPTION OF THE DRAWINGS

The semiconductor chips, the mounting devices and method will now be explained in more detail with reference to the accompanying figures, where:

FIG. 1 shows a basic perspective view of a semiconductor wafer separated into semiconductor chips on a separating support;

FIG. 2 shows a basic perspective view of an electromagnetic lifter when lifting off semiconductor chips from the separating support;

FIG. 3 shows a basic partly perspective view of a collecting position of the device for semiconductor chips with conveying to a pick-up position of a conveying roller; and FIG. 4 shows a basic schematic diagram of the lining of the semiconductor chips between two films with conveying and transferring of the semiconductor chips with the aid of the conveying roller from a pick-up position to a discharge position.

DETAILED DESCRIPTION

Described herein is a readily marketable TAG chip and in respect thereof, a device which makes it possible to introduce semiconductor chips cost-effectively in liners in a reliable manner at a high throughput rate and a mounting method using a device of this type. This is achieved via the subject matter of the independent claims. Advantageous developments of the described devices and methods emerge from the dependent claims.

A semiconductor chip for RF TAG applications comprises at least one integrated circuit element and an active identification and/or authentication element that provides for storing and exchanging information with regard to an object of everyday use. The semiconductor chip comprises a thickness of less than 100 μm and a magnetic coating or an electrostatically chargeable structure.

RF TAG semiconductor chips can for example be adhesively bonded on merchandise in the form of a merchandise label or be incorporated in an object, for example a banknote. The semiconductor chip is used to store information about the merchandise. The information can be the price, the product number, the production number, etc. This information can be read contactlessly via a reader and the merchandise can thereby be identified and/or authenticated.

The semiconductor chip comprises a handling element (e.g., a magnetic coating or an electrostatically chargeable structure). This enables the simplified handling of the semiconductor chip during the production method and the mounting method, since the handling can be carried out via magnetic or electrostatic force.

In one embodiment, the magnetic coating or the electrostatically chargeable structure is arranged on the rear side of the semiconductor chip. This has the advantage that the functionality of the circuit element is influenced to a lesser extent by the magnetic force. In a second embodiment, the magnetic coating or the electrostatically chargeable structure is arranged on the top side of the chip. This arrangement has the advantage that the rear side of the chip can be mounted more simply on an object. The magnetic coating can be a closed layer or a structured layer.

The magnetic layer can include a nickel coating, which optionally has a thickness of a few micrometers. A nickel coating has the advantage that nickel coatings are commonly used in semiconductor technology, such that a coating can be applied reliably.

In an alternative embodiment, the magnetic coating comprises ferromagnetic or ferrimagnetic particles. The particles can be embedded in a photoresist layer.

Optionally, the semiconductor chip has an area of less than approximately 1 $mm^2$, optionally less than approximately 0.5 $mm^2$. It is advantageous if the thickness of the semiconductor chip is less than 50 μm. A thin semiconductor chip is particularly advantageous in applications such as a banknote, since the object itself is very thin. A thin semiconductor chip is also advantageous if the chip is incorporated into the package of an object (e.g., a DVD).

In one embodiment, the semiconductor chip comprises an integrated antenna. This is advantageous in applications in which the semiconductor chip is incorporated or integrated into the object, since an additional external antenna is not required.

The semiconductor chip can also comprise at least two connections. The connections enable a coupling, for example, for an external antenna, a transponder or a power source. An external antenna connected to the connections has the advantage that the stored information can be contactlessly read from a greater distance.

In one embodiment, the semiconductor chip comprises a nonvolatile memory that is programmable only once for storing the information. This is advantageously used in authentication applications.

The semiconductor chip comprises a nonvolatile memory for storing the information and further comprises a security circuit. The security circuit is equipped with a non-erasable memory and adapted in such a way that it blocks the programming of the nonvolatile memory with regard to the information contents of the non-erasable memory. This arrangement makes it possible for the memory to be programmable piecewise without the stored information being able to be erased or changed.

The invention specifies a semiconductor wafer, comprising a plurality of semiconductor chips according to one of the preceding embodiments. A semiconductor wafer comprising a plurality of semiconductor chips for RF TAG applications is coated with a magnetic coating or an electrostatically chargeable structure. The wafer is then singulated.

In one embodiment, at least one semiconductor chip comprises a magnetic coating having a larger or smaller magnetic force than at least one second semiconductor chip. This makes it possible for the chip to be able to be lifted off separately from the other semiconductor chips from the singulated wafer.

According to the invention, the functionality of the semiconductor chips can be tested prior to the separating process. The defective semiconductor chips can be selectively coated with a magnetic coating having a higher force and be lifted off from the wafer and discarded. The correctly functioning chips can be lifted off in a second step and be packed as bulk material for delivery or for mounting.

The invention specifies a device for lifting off semiconductor chips comprising a magnetic coating or an electrostatically chargeable structure. For this purpose, the device comprises an electromagnetic or electrostatic lifter including a magnetically and/or electrostatically chargeable head. The head is able to pick up singulated semiconductor chips of a semiconductor wafer comprising a magnetic coating and/or electrostatically chargeable structure from a wafer position and to deposit them in a collecting position. The collection position need not be situated at the mounting apparatus, but rather can be a small (glass) tube in which the chips are collected and delivered as bulk material to the customers, and the latter in turn then "tip" the chips into the machine feed.

The device furthermore comprises a collecting container, which, with a conveyor mechanism (e.g., vibrating conveyor) conveys the semiconductor chips from the collecting position to a pick-up position.

This device is used for lifting off RF TAG semiconductor chips from a wafer. The chips are conveyed to a collecting position and deposited. In one embodiment, the collecting position includes a collecting container, in which semiconductor chips can be stored. In a second embodiment, the chips are collected and led to a mounting device.

The invention specifies a device for mounting semiconductor chips comprising a magnetic coating or an electrostatically chargeable structure. The device includes a pick-up position, in which the chips to be mounted can be arranged. The pick-up position can comprise a feed container for a plurality of chips.

Furthermore, the device comprises a conveying roller including conveying receptacles for semiconductor chips. In this case, the conveying receptacles can be electromagnetically or electrostatically activated in the pick-up position and can be deactivated in a discharge position. Furthermore, the conveying roller has an axis about which the roller can rotate from the pick-up position to the discharge position.

This device has the advantage that an extreme increase in manufacturing rate for populating liners or objects of everyday use can be achieved, on account of the rotational speed of the conveying roller with pick-up position and discharge position, and also on account of densely distributed conveying receptacles on the periphery of the roller. The only prerequisite for the functionality of this device is that the semiconductor wafer from which the semiconductor chips have been sawn comprises a corresponding electrostatically chargeable structure on its rear side or its top side, or a corresponding magnetic coating on its rear side or its active top side.

As mentioned above, at least magnetic structures in any desired configuration can be applied on a semiconductor chip or semiconductor wafer, such that the functionality of the device according to the invention is assured. Consequently, a plurality of semiconductor chips can be reliably and simultaneously picked up from a sawing film that provides a carrier of the sawn apart semiconductor wafer, and upon deactivation of the electromagnetic or electrostatic attraction of the lifter, the semiconductor chips can be brought to a collecting position.

This process is typically carried out by the semiconductor manufacturer, such that the form of delivery is optionally bulk material. For this purpose, it is also possible to previously carry out a sorting of the "non-good dies", which, after the wafer sampling and sawing, are "fished out" from the bulk material either by "pick and scrap" or by additional inking (prior to sawing) with magnetic ink after singulation via the sufficiently different magnetic forces.

The advantage of the populating roller or of the rotatable roller comprising a plurality of conveying receptacles is that, as a result of providing a plurality of conveying receptacles on the periphery of the conveying roller, a high throughput rate can be achieved when populating liners.

In one optional embodiment of the device, the lifter comprises a soft-magnetic core, which is mechanically connected to the magnetic head, and a coil, which is wound around the core. In such a construction, comprising a soft-magnetic core and a coil, the magnetic head can be activated and deactivated in terms of its magnetic attraction effect. If the semiconductor chips include corresponding magnetically active coatings, the semiconductor wafer can merely be heated for a short time on its sawing support in order to reduce the degree of adhesion of the sawing film, such that it becomes possible to detach the semiconductor chips from the sawing film, and a high attraction of the magnetic head, then, picks up the semiconductor chips and conveys this plurality of semiconductor chips to a collecting position.

In a further embodiment, the collecting container with a shaking conveyor mechanism of the device includes a feed tube arranged adjacent to the pick-up position of the conveying roller. In this case, the feed tube is continuously supplied, via the shaking mechanism, with semiconductor chips that have accumulated in the collecting container, such that a large plurality of semiconductor chips are available to be picked up onto the peripheral lateral surface of the roller in corresponding conveying receptacles. At the discharge position, the electromagnetically or electrostatically active conveying receptacle is deactivated, such that the semiconductor chips can be applied in a targeted manner on a liner at a predetermined distance. Consequently, the device advantageously has all the prerequisites for providing an improved method for populating liners with a correspondingly increased throughput for semiconductor chips.

One particular aspect of the invention relates to the use of these devices for lifting off and mounting RF TAG chips with an integrated RF antenna on a liner. A corresponding optional packing method for semiconductor chips includes the following method steps. First, the semiconductor wafer of the semiconductor chips to be mounted is coated with a permanent-magnetic material. The wafer is fixed onto a separating support (e.g., an adhesive-coated film). The individual semiconductor chips are separated from the wafer. This can be carried out via sawing. It is also conceivable to coat the semiconductor chips themselves with a permanent-magnetic material. Afterwards, the semiconductor chips are lifted off from the support, such as a sawing film, by an electromagnetically active lifter. The semiconductor chips are then brought to a collecting position. The collecting position can include a collecting container with a shaking conveyor mechanism.

In one optional exemplary implementation of the method, a photoresist filled with ferromagnetic or ferrimagnetic particles is applied for coating the semiconductor wafers of the semiconductor chips to be mounted or for coating the semiconductor chips. Such a coating method can be carried out on a large scale on the rear side of semiconductor wafers and can also be applied advantageously on the active top side of the semiconductor wafers. In this case, in a further step, the photoresist can be patterned photolithographically in order that on the top side of the semiconductor chip, for example, only specific regions in which the function of the semiconductor chip is not impaired are enriched with magnetic particles. In this case, it is also possible to realize elongated magnetic structures that facilitate alignment of the semiconductor chips. As an alternative, the magnetic coating can be applied via sputtering technology.

The method according to the invention can also comprise the following additional steps. Prior to separating the wafer, the semiconductor chips can be functionally tested and the defective semiconductor chips can be identified and marked. The wafer is then singulated. After separating the individual chips from the wafer, the defective semiconductor chips are lifted off separately from the wafer.

In one optional embodiment of the method, the defective chips are coated with a second magnetic or electrostatic coating. The second magnetic coating has a stronger or a weaker magnetic force. The defective chips or the correctly functioning semiconductor chips can be lifted off from the support via the electromagnetically or electrostatically active lifter.

In this embodiment, the two groups of semiconductor chips comprise a coating having a different magnetic or electrostatic force. The group with the stronger magnetic coating can be removed from the wafer first. The second group can then be lifted off. This method has the advantage that the separation of the defective chips from the wafer can be carried out simultaneously and in one step.

In an alternative embodiment, the defective chips can be lifted off from the support via a pick-and-place machine. This method has the advantage that a device for selectively coating the semiconductor chips can be dispensed with.

After the lift-off, the correctly functioning semiconductor chips can be collected in a collecting container and assigned. The container can be used as bulk material for delivery to the customers or to the mounting device.

In a further optional embodiment of the method, prior to lifting off the semiconductor chips from a support via an electromagnetically active lifter, the support is heated in order to reduce the adhesion force of a thermoplastic adhesive between support and semiconductor chip. Such heating can optionally be between 80° C. and 150° C., such that, with low magnetic or electrostatic field strength, the semiconductor chips can be removed from the support and be positioned at the head of the lifter.

In a further method step when carrying out the mounting method, for lifting off the semiconductor chips, a current is conducted through a coil of the lifter in order to activate a magnetic head of the lifter, which lifts off the semiconductor chips from the support. It is thus possible, depending on the size of the magnetic head, to lift off the plurality of semiconductor chips of a semiconductor wafer from the support simultaneously. For collecting the semiconductor chips in the collecting container, the lifter is moved to a collecting position and, above the collecting container, the lifter is then deactivated electromagnetically, such that the semiconductor chips can fall into the collecting container.

Finally, the semiconductor chips are conveyed in a feed tube to a pick-up position of a mounting device. After individual semiconductor chips have been picked up onto corresponding conveying receptacles of a conveying roller, the conveying roller is rotated from the pick-up position into a discharge position with the semiconductor chips being discharged onto a liner. With correspondingly rapid follow-up loading of semiconductor chips from the collecting container, a high rotational speed can consequently be set for the roller, thereby enabling a rapid transfer with a high throughput from the pick-up position to the discharge position.

The semiconductor chips can be conveyed further in a feed tube to a pick-up position with shaking via a shaking conveyor mechanism of the collecting container and/or by airstream conveying and/or by electrostatic attraction and/or by electromagnetic attraction. In this case, the shaking conveyor mechanism can also be supported only by these different auxiliary means in the conveying of the semiconductor chips to the feed tube.

In order to discharge individual semiconductor chips into the corresponding conveying receptacles of a conveying roller from the feed tube in the pick-up position, the conveying roller comprises an electromagnetic head in the region of the conveying receptacle, the head being activated in each case for picking up the individual semiconductor chips. Finally, the electromagnetic head of the conveying receptacle is deactivated for discharging individual semiconductor chips from the conveying roller and from the conveying receptacles on a liner or an object of everyday use in the corresponding discharge position, such that positioning on a liner is possible.

To summarize, it can be established that this method has considerable advantages over previous solutions. Thus, the semiconductor chips are fed as bulk material in a magnetic and/or electrostatic field to a rapidly running roller which is locally magnetized or electrostatically charged at the corresponding locations of the conveying receptacles. The magnetic or electrostatic forces fix the semiconductor chip on the roller in the conveying receptacles, which then deposit the chip on a previously prepared liner. In this case, the previous preparation can include providing an adhesive or an electrostatically charged structure or a magnetic coating on the liner in the corresponding positions. With the device according to the invention it is possible to position more than 20 semiconductor chips per second on the liner, which corresponds to a throughput of less than 50 ms per populating operation.

The picking up and discharging of the semiconductor chips in the corresponding conveying receptacles of the conveying roller can be supported by fine holes to the conveying receptacles, by virtue of the fact that the hole is evacuated during the pick-up and a small excess pressure is made available in the hole during the discharge.

The coating of the semiconductor chips with magnetic or electrostatically chargeable materials is advantageously effected at the wafer level on the top side or on the rear side of the semiconductor wafer, a whole-area coating being effected in the simplest case. The semiconductor wafer can then be fixed on a support with the aid of a thermoplastic material such as wax and can be sawn or separated into individual semiconductor chips via a laser method. Such laser methods have the advantage that the outer contour of the semiconductor chips need not be rectangular, such that sharp-edged forms that otherwise occur during sawing can be avoided.

This means that the device according to the invention exhibits a further minimization of susceptibility to disturbances, particularly when the semiconductor chips are fed through the feed tube. Since, after the separating operation, the semiconductor chips lay individually on the support, they can be taken from the support with simultaneous heating and be collected in a collecting container. If necessary, the semiconductor chips, in addition, can be cleaned and washed in this bulk material form of the collecting container. On account of the shaking mechanism or else on account of magnetic or electrostatic fields, the semiconductor chips float into the feed tube to the pick-up position.

Manufacturing rates of between the abovementioned 20 and even 100 components per second are possible in this case, such that this corresponds to the printing rate of banknotes, labels and other smart cards or packaging materials. The feeding functions are also improved; the greater the alignment moment for the semiconductor chips (i.e., the more elongate the embodiment of a chip or a magnetic structure on the chip), the greater and more reliable the magnetic alignment effect are for such semiconductor chips.

In the following paragraphs, exemplary embodiments of the semiconductor chip, the mounting device and method of mounting are described in connection with the figures.

FIG. 1 shows a basic perspective view of a semiconductor wafer 5 separated into semiconductor chips 1 on a separating support 19. The separating support 19 is a planar plate with a coating of a thermoplastic (e.g., a wax coating) which holds the semiconductor wafer 5 during the separating operation on the support 19. The rear side of the semiconductor wafer 5 was provided with a magnetic coating 2 prior to application to the support 19, the magnetic coating 2 comprising a photoresist filled with ferrimagnetic or ferromagnetic particles.

The semiconductor chips 1 are suitable for RF TAG applications and comprise at least one integrated circuit element and an active identification and/or authentication element that provides for storing and exchanging information with regard to an object of everyday use. The semiconductor chips further comprise an integrated antenna. The semiconductor chips 1 have a thickness of approximately 100 µm and an area of approximately 0.5 mm². The rear side of the semiconductor chips 1 comprises a magnetic coating 2.

FIG. 2 shows a basic perspective view of an electromagnetic lifter 3 when lifting off semiconductor chips 1 from the separating support 19. The semiconductor wafer 5 separated into semiconductor chips 1 is brought onto a hot plate 21 into a wafer position 6 on its separating support 19 after the separating operation has ended. The hot plate 21 is heated to a temperature of between 80° C. and 150° C. via a heating current I, such that the thermoplastic adhesive 20 softens and the semiconductor chips 1 can be lifted off the support 19 without high expenditure of force.

For this purpose, an electromagnetic lifter 3 is positioned in the lift-off position 22 above the semiconductor wafer 5 separated into semiconductor chips 1 and a magnetization current $I_M$ is conducted through a coil 15 of the electromagnetic lifter 3, such that the soft-magnetic core 14 within the coil 15 is magnetized and transfers this magnetic effect to the magnetic head 4, which ensures that, under the action of the magnetic field between the magnetic head 4 and the magnetic coating 2 of the semiconductor chips 1 of the semiconductor wafer 5, the semiconductor chips 1 then adhere to the magnetic head 4 by their magnetic coating 2.

FIG. 3 shows a basic partly perspective view of a collecting position 7 of the device for semiconductor chips 1 with conveying to a pick-up position 10 of a conveying roller 11. In the collecting position 7, the electromagnetic lifter 3 is deactivated by the current $I_M$ being switched off with the opening of the switch 23, such that the semiconductor chips 1 fall from the magnetic head 4 into the collecting position 7 of the collecting container 8. Via a shaking conveyor mechanism 9 or via correspondingly aligned magnetic fields, the semiconductor chips 1 provided with magnetic coating 2 are then fed to a feed tube 16, which stacks the semiconductor chips 1 and keeps them ready in a pick-up position 10 for picking up by the conveying roller 11.

For this purpose, the conveying roller 11 includes on its peripheral a plurality of pick-up positions or conveying receptacles 12, of which only a single conveying receptacle 12 is shown in this cross-sectional view of the conveying roller 11. The conveying receptacle 12 is activated and deactivated via an electromagnetic coil and can therefore draw the semiconductor chips 1 provided with a magnetic coating 2 into the conveying receptacle 12. With the conveying roller 11 being rotated about the axis 13 in arrow direction B, a plurality of chips 1 can thus be picked up in rapid succession into the different conveying receptacles 12 distributed on the periphery of the conveying roller 11. This picking up can be supported by a central hole 24 in the center of the conveying receptacle 12, in which the cavity 25 of the shaft 26 is evacuated. Conversely, a slight excess pressure can be used to ensure that the semiconductor chips 1 are discharged from the conveying receptacle 12 when the discharge position is reached.

FIG. 4 shows a basic schematic diagram of the lining of the semiconductor chips 1 between two films with conveying and transferring of the semiconductor chips 1 with the aid of the conveying roller 11 from a pick-up position 10 to a discharge position 17. For this purpose, in the pick-up position 10, the stack of semiconductor chips 1 in the feed tube 16 is brought into individual conveying receptacles 12 of the conveying roller 11 and, with the rotation of the conveying roller 11 in rotation direction B, all the conveying receptacles 12 distributed on the periphery are populated with semiconductor chips 1 until they reach the discharge position 17, in which they are deposited onto the liner 18 in arrow direction C. In one optional embodiment, the liner comprises banknotes.

For this purpose, the liner 18 can include an adhesive layer on its top side, or it can also have a magnetic coating at the positions at which semiconductor chips 1 are intended to be fixed. The liner 18 is fed via a conveyor 27 and runs continuously in arrow direction D after the liner 18 has been populated with corresponding semiconductor chips 1 at equidistant distances. A lining film 28 fed via a roller 29 is subsequently applied over the liner 18. The lining film 28 is adhesively bonded in an adhesive-bonding or laminating position 33 with the liner 18 between the individual semiconductor chips 1, such that the semiconductor chip 1 is completely surrounded by lining film material. The lining film material can be locally printed, or have specific bar codes, in order to identify the TAG semiconductor chip at any time.

The composite comprising lining films 18 and 28 and semiconductor chips 1 is then fed to a separating position 30, in which a blade 31 moving in arrow directions E and F performs a separating operation, such that individual semiconductor chips 1 lined on both sides fall into a collecting position 32 for finished, double-sided lined chips.

In a second exemplary embodiment, the conveying roller is used to lift off RF TAG semiconductor chips from a collecting container and to mount them onto a plurality of objects of everyday use. Examples of such objects include, but, are not limited to: sneakers, DVDs, luxury goods, luggage, or other goods whose whereabouts are to be tracked.

What is claimed is:

1. A semiconductor chip for RF TAG applications, the semiconductor chip comprising:
   at least one integrated circuit element;
   an active identification and/or authentication element that provides for storing and exchanging information with regard to an object;
   a nonvolatile memory for storing information;
   a security circuit equipped with a non-erasable memory, the security circuit being adapted to block programming of the nonvolatile memory with regard to information contents of the non-erasable memory; and
   a handling element configured to enable handling of the semiconductor chip by a device,
   wherein the semiconductor chip has a thickness of less than 100 µm.

2. The semiconductor chip of claim 1, wherein the handling element is arranged on a rear side of the chip.

3. The semiconductor chip of claim 1, wherein the handling element is arranged on a top side of the chip.

4. The semiconductor chip of claim 1, wherein the handling element is a closed layer.

5. The semiconductor chip of claim 1, wherein the handling element is a structured layer.

6. The semiconductor chip of claim 1, wherein the handling element comprises a magnetic coating comprising ferromagnetic or ferrimagnetic particles.

7. The semiconductor chip of claim 1, wherein the handling element comprises a magnetic coating comprising magnetic coating comprises a nickel coating.

8. The semiconductor chip of claim 1, wherein the thickness of the semiconductor chip is less than approximately 50 µm.

9. The semiconductor chip of claim 1, wherein the semiconductor chip comprises an area of less than approximately 0.5 mm$^2$.

10. The semiconductor chip of claim 1, further comprising:
    an integrated antenna.

11. The semiconductor chip of claim 1, further comprising:
    at least two connections.

12. The semiconductor chip of claim 11, further comprising:
    an antenna connected to the connections.

13. The semiconductor chip of claim 1,
    wherein the nonvolatile memory is programmable only once for storing information.

14. The semiconductor chip of claim 1, wherein the handling element comprises one of: a magnetic coating and an electrostatically chargeable structure.

15. A semiconductor wafer including a plurality of semiconductor chips, individual ones of the semiconductor chips comprising:
    at least one integrated circuit element;
    an active identification and/or authentication element that provides for storing and exchanging information with regard to an object;
    a nonvolatile memory for storing information;
    a security circuit equipped with a non-erasable memory, the security circuit being adapted to block programming of the nonvolatile memory with regard to information contents of the non-erasable memory; and
    a handling element configured to enable handling of the semiconductor chip by a device,
    wherein the semiconductor wafer has a thickness of less than 100 µm.

16. The semiconductor wafer of claim 15, wherein the handling element comprises one of: a magnetic coating and an electrostatically chargeable structure.

17. The semiconductor wafer of claim 15, wherein:
    the handling element of at least one first semiconductor chip comprises a magnetic coating with a first magnetic force; and
    the handling element of at least one second semiconductor chip comprises a magnetic coating with a second magnetic force, the first magnetic force being different from the second magnetic force.

18. A semiconductor wafer including a plurality of semiconductor chips, individual ones of the semiconductor chips comprising:
    at least one integrated circuit element;
    an active identification and/or authentication element that provides for storing and exchanging information with regard to an object; and
    a handling element comprising one of: a magnetic coating and an electrostatically chargeable structure, wherein:
    the handling element of at least one first semiconductor chip comprises a first magnetic force;
    the handling element of at least one second semiconductor chip comprises a second magnetic force, the first magnetic force being different from the second magnetic force; and
    the semiconductor wafer has a thickness of less than 100 µm.

* * * * *